United States Patent
Pathak et al.

(10) Patent No.: US 7,167,404 B2
(45) Date of Patent: Jan. 23, 2007

(54) METHOD AND DEVICE FOR TESTING CONFIGURATION MEMORY CELLS IN PROGRAMMABLE LOGIC DEVICES (PLDS)

(75) Inventors: Shalini Pathak, Haryana (IN); Parvesh Swami, New Delhi (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 513 days.

(21) Appl. No.: 10/436,895

(22) Filed: May 13, 2003

(65) Prior Publication Data

US 2004/0015758 A1    Jan. 22, 2004

(30) Foreign Application Priority Data

May 13, 2002    (IN)    ............................. 550/Del/02

(51) Int. Cl.
    *G11C 7/00*    (2006.01)

(52) U.S. Cl. ................. 365/201; 365/230.09; 365/221; 365/219; 365/220; 714/742; 714/733; 714/725; 714/763; 714/819

(58) Field of Classification Search ......... 365/201.219, 365/220, 221; 714/742, 733, 725, 763, 819
See application file for complete search history.

(56) References Cited

U.S. PATENT DOCUMENTS

| | | | | | |
|---|---|---|---|---|---|
| 5,430,687 | A | * | 7/1995 | Hung et al. ............ | 365/230.08 |
| 5,583,450 | A | * | 12/1996 | Trimberger et al. ......... | 326/41 |
| 5,646,546 | A | * | 7/1997 | Bertolet et al. ............... | 326/39 |
| 5,732,407 | A | * | 3/1998 | Mason et al. ............... | 711/104 |
| 5,778,256 | A | * | 7/1998 | Darbee ........................ | 710/72 |
| 5,841,867 | A | * | 11/1998 | Jacobson et al. ........... | 713/187 |
| 5,970,005 | A | * | 10/1999 | Yin et al. .................... | 365/201 |
| 6,009,256 | A | * | 12/1999 | Tseng et al. ................. | 703/13 |
| 6,057,704 | A | * | 5/2000 | New et al. .................... | 326/38 |
| 6,191,614 | B1 | * | 2/2001 | Schultz et al. ............... | 326/41 |
| 6,195,774 | B1 | * | 2/2001 | Jacobson .................... | 714/727 |
| 6,237,124 | B1 | | 5/2001 | Plants ......................... | 714/763 |
| 6,262,596 | B1 | * | 7/2001 | Schultz et al. ............... | 326/41 |
| 6,278,290 | B1 | * | 8/2001 | Young ......................... | 326/41 |
| 6,429,682 | B1 | * | 8/2002 | Schultz et al. ............... | 326/41 |
| 6,539,508 | B1 | * | 3/2003 | Patrie et al. ................ | 714/726 |
| 6,664,807 | B1 | * | 12/2003 | Crotty et al. ................. | 326/40 |

(Continued)

FOREIGN PATENT DOCUMENTS

JP    410097511 A    *    4/1998

(Continued)

*Primary Examiner*—Viet Q. Nguyen
(74) *Attorney, Agent, or Firm*—Lisa K. Jorgenson; Allen, Dyer, Doppelt, Milbrath & Gilchrist, P.A.

(57) ABSTRACT

A programmable logic device (PLD) has the ability to test the configuration memory either independently or during configuration. The PLD may include a selector for selecting a particular column or row of the configuration memory array, and an input data storage device for storing configuration data required to be stored in the selected column or row, or test data for testing the selected column or row. The PLD may also include an output data storage device for storing the output from the selected column or row, and test logic that provides control signals for verifying the correct operation of the data lines of the configuration memory array without disturbing the data stored in the memory array.

14 Claims, 6 Drawing Sheets

U.S. PATENT DOCUMENTS

| | | | |
|---|---|---|---|
| 6,774,667 B1 * | 8/2004 | Chan | 326/37 |
| 6,774,669 B1 * | 8/2004 | Liu et al. | 326/41 |
| 6,774,672 B1 * | 8/2004 | Lien et al. | 326/47 |
| 6,817,006 B1 * | 11/2004 | Wells et al. | 716/16 |
| 6,864,712 B1 * | 3/2005 | Agarwal et al. | 326/41 |
| 6,891,395 B1 * | 5/2005 | Wells et al. | 326/38 |
| 6,985,096 B1 * | 1/2006 | Sasaki et al. | 341/100 |
| 2005/0144215 A1 * | 6/2005 | Simkins et al. | 708/620 |

FOREIGN PATENT DOCUMENTS

JP        02000030499 A   *   1/2000

\* cited by examiner

METHOD AND DEVICE FOR TESTING CONFIGURATION MEMORY CELLS IN PROGRAMMABLE LOGIC DEVICES (PLDS)

FIELD OF THE INVENTION

The present invention relates to the field of electronic devices, and, more particularly, to programmable logic devices (PLDs) and methods/devices for testing the same.

BACKGROUND OF THE INVENTION

PLDs are general-purpose logic devices which can be configured for various operations. Current developments in PLDs are making it possible to enhance the flexibility and complexity of these devices. Many PLDs provide complete system capabilities, including on-chip memories and a large variety and number of logic elements, that are electrically programmed for providing the desired operation by using configuration memory cells. To ensure correct implementation of functionality, it is desirable to have the ability to test the configured configuration memory cells for correctness of programming.

U.S. Pat. No. 6,237,124 describes a method for testing the configuration memory by using cyclical redundancy checking (CRC). In this technique the CRC mechanism is used to check for a single event upset (SEU) in the configuration process of the static random access memory (SRAM) of a field programmable gate array (FPGA). In one particular SRAM-based FPGA architecture described in the patent, an erasable programmable read only memory (EPROM) resides on a printed circuit board near the FPGA. This EPROM stores the configuration data for programming the configuration SRAM for the FPGA core. An EPROM controller on the FPGA directs a data stream from the EPROM into the FPGA.

The EPROM controller serializes the data stream from the EPROM into a data stream one bit wide. This data stream is synchronized to an internal clock and provides data to various portions of the FPGA architecture including control logic, row and column counters, a CRC circuit, and the configuration SRAM for the FPGA core. The CRC circuit tests the data stream from the EPROM to verify that it is correct. Also, the CRC circuit can test the data in the configuration SRAM after loading. A multiplexer selects whether the data to be checked by the CRC circuit is the input data stream or the data in the configuration SRAM. When incorrect configuration data is detected in the configuration SRAM of the FPGA core, the CRC circuit can signal the EPROM controller that an error has occurred. The EPROM controller can use this information to output an error signal from the FPGA and/or initiate a reload from the EPROM.

The configuration circuitry described above may be adequate for configuring a conventional memory array, but it includes no mechanism by which the full configuration process could be tested. For example, the CRC bits or the frame check sequence bits loaded after every frame of data make it possible to check for an error that may occur in loading the data frames in the internal shift register. Yet, the data lines themselves could be faulty with bits stuck at logic 1 or stuck at logic 0. In such a case, the data may not have correctly reached its destination, and to verify whether it was correct or not would require tracing back every bit of stored data.

SUMMARY OF THE INVENTION

An object of the invention is to provide bit-by-bit tracking of the data latched in the configurable data latch array.

Another object of the invention is to enable testing of a PLD configuration memory in a relatively transparent manner.

To achieve these and other objects, the present invention provides a PLD having the ability to test a configuration memory thereof either independently or during configuration. In particular, the PLD may include a selector for selecting a particular column or row of the configuration memory array, and an input data storage circuit for storing configuration data required to be stored in the selected column or row (or test data for testing the selected column or row). The PLD may further include an output data storage circuit for storing the output from the selected column or row, and test logic that provides control signals for verifying the correct operation of the data lines of the configuration memory array without disturbing the data stored in the memory array.

The test logic may deselect the inputs and outputs of the storage cells in the memory array from the columns or rows of the memory array during testing. The correct operation of the data lines of the memory array is verified by applying various test patterns including, "all 0", "all 1", "walking 0" and "walking 1" test patterns, and reading back and verifying the output from the memory array.

BRIEF DESCRIPTION OF THE DRAWINGS

Various objects and advantages of the invention will become more apparent in reference to the following description and the accompanying drawings, in which.

DETAILED DESCRIPTION OF THE PREFERRED EMBODIMENTS

For clarity of illustration and explanation, the present invention will be described with reference to an 8×8 configuration memory cell array for configuration of an array of logic modules and interconnect architecture. Yet, embodiments with other array structures are also contemplated by the present invention, as will be appreciated by those of skill in the art. The following description of the present invention is only illustrative and not in any way limiting.

Figure 1A:
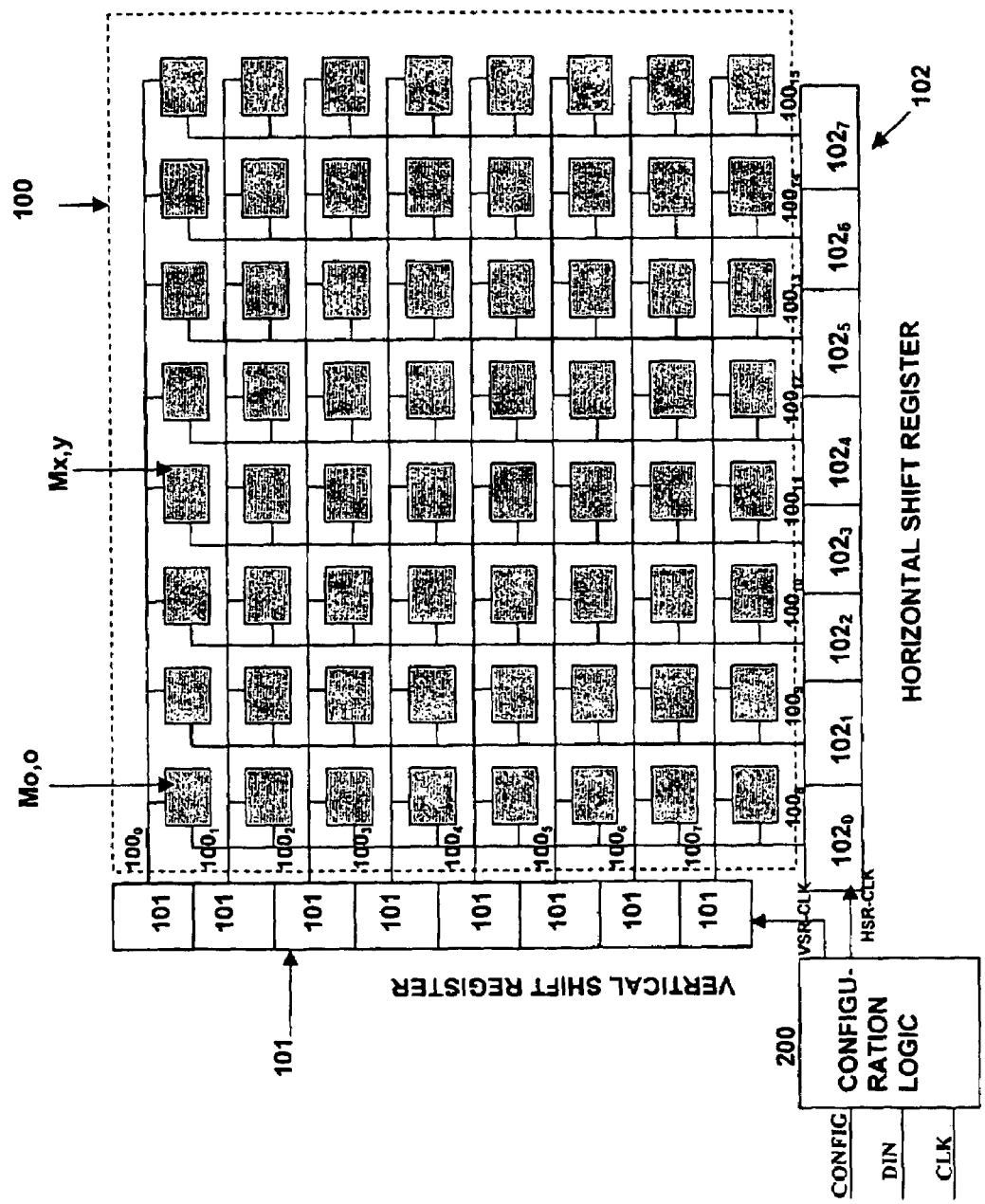
FIG. 1A is schematic block diagram of a prior art configurable memory latch array.

The configurable memory cells of a PLD are typically arranged in an array and loaded using serial bit streams of configuration data. Referring initially to FIG. 1A, a configuration memory array 100 according to the prior art is illustratively shown. The configuration memory array 100 includes memory cells $M_{x,y}$, where x and y correspond to the row and column location, respectively, of each configuration memory cell.

The configuration of data into the configuration memory array is achieved by shifting the bit stream of configuration data through a vertical shift register 101 controlled by a clocking mechanism 200 until a frame of data (8 bits wide in this example) has been shifted into bit register 101. This frame of data is then released in parallel through horizontal data lines $100_7$ to $100_0$ into a column of configuration memory cells enabled by horizontal shift register 102. The column is addressed by shifting a high/low bit to one of the selected vertical lines $100_8$–$100_{15}$ via the flip-flop array 102 using one shift per frame. The loading of data is therefore performed in a serial in, parallel out (SIPO) mode. When the high/low bit shifts out to the extreme right, it causes the DONE signal (not shown) of the configuration logic to go high, which provides an indication that the configuration is complete.

Figure 1B:
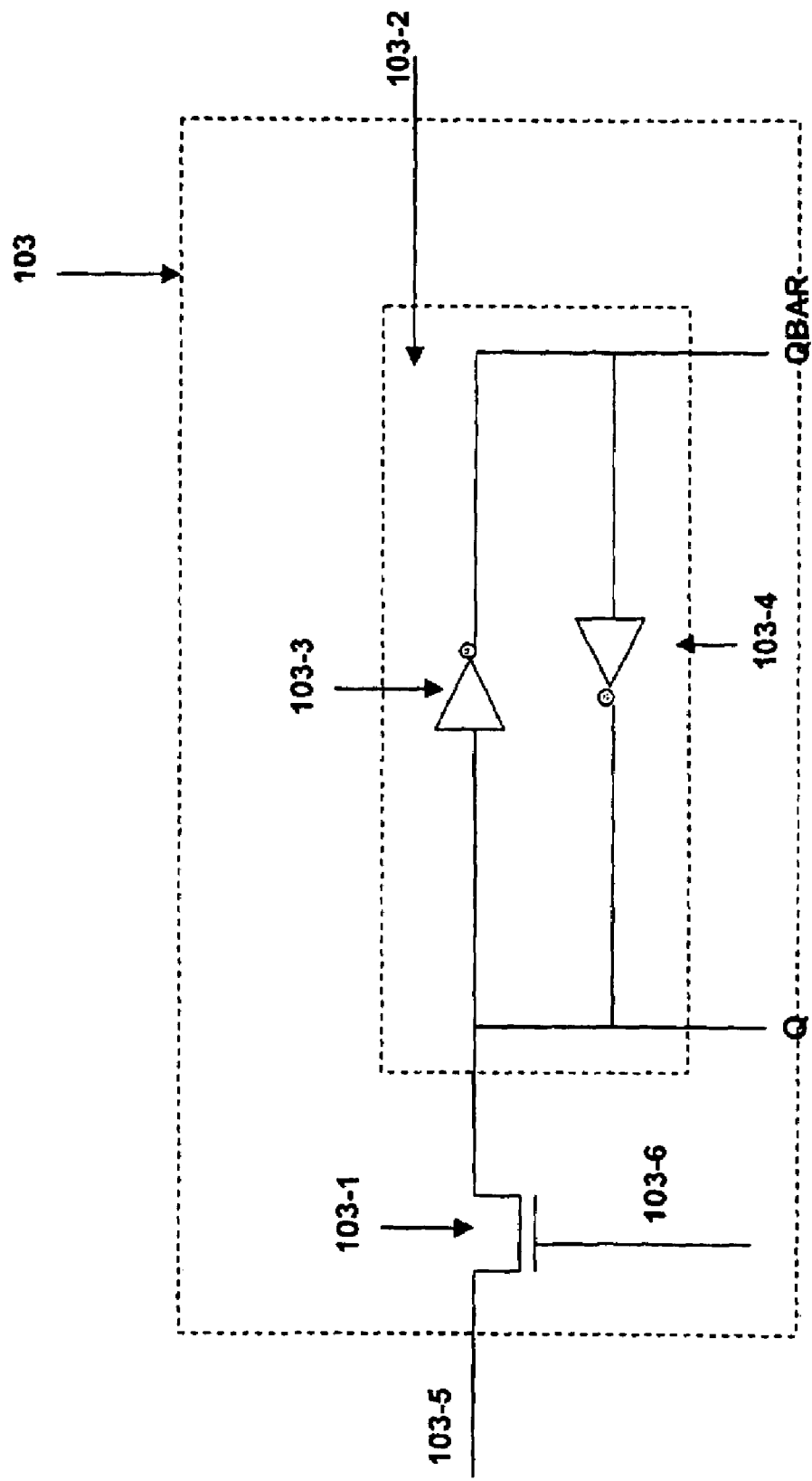
FIG. 1B is a schematic diagram of a prior art configuration memory cell.

Turning now to FIG. 1B, the circuit diagram of a single memory cell 103 is now described. The memory cell $M_{0,0}$ includes a latch 103-2 formed by two back-to-back inverters 103-3 and 103-4 that stores a bit value passed by the pass transistor 103-1. During configuration when the high bit is shifted to line 1035 the pass transistor 103-1 gets enabled and the information present at the line 103-6 is configured in the data latch. In the configuration block, the lines 103-5 and 103-6 are the outputs of shift registers 102 and registers 101 of FIG. 1A, respectively. This arrangement does not allow for the testing of the configured data latches.

Figure 2A:
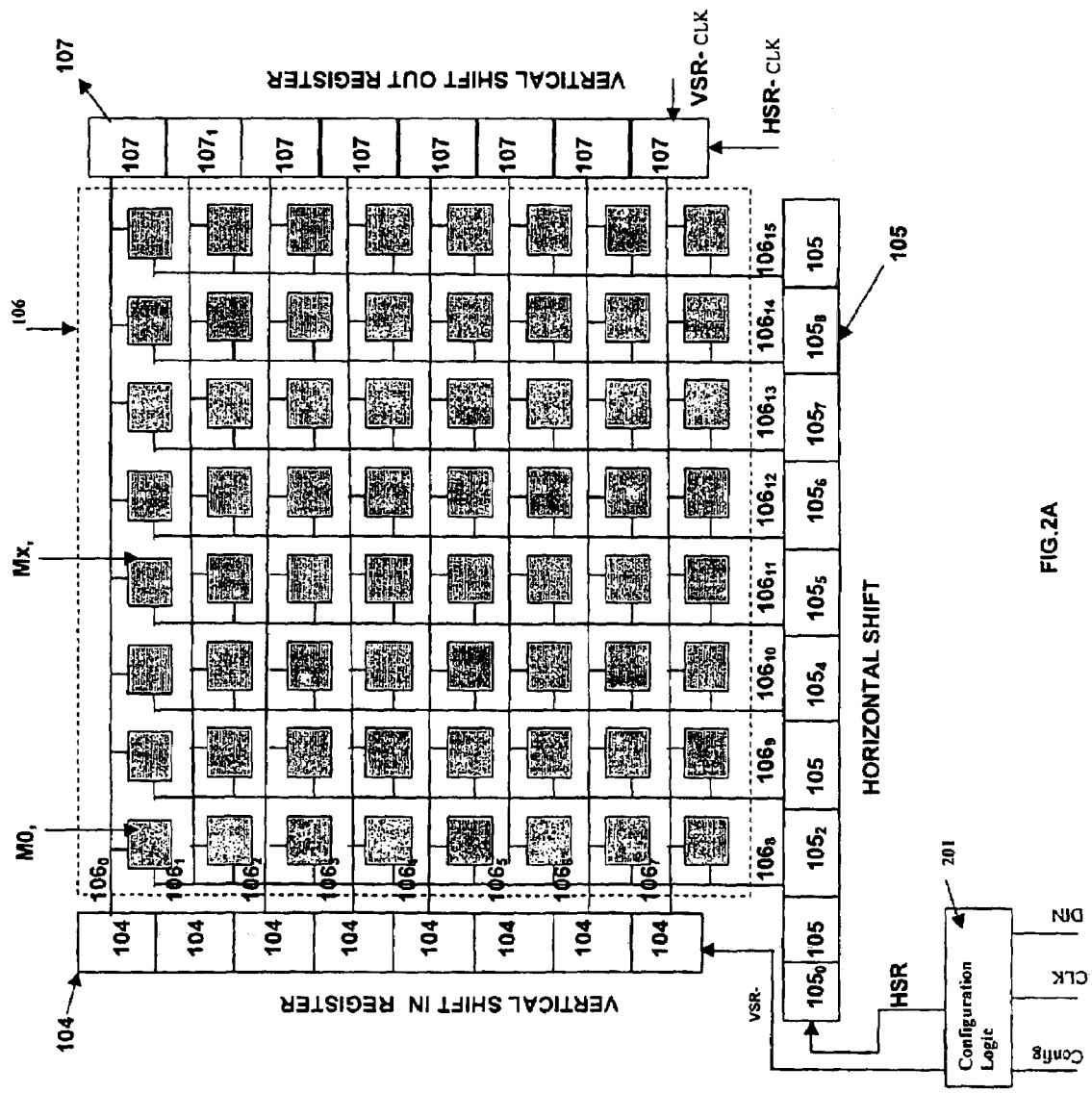
FIG. 2A is a schematic block diagram illustrating a PLD configuration memory in accordance with one embodiment of the present invention.

A simplified diagram of the configuration process according to the present invention is illustrated in FIG. 2A. The invention incorporates a mechanism for enabling the test of configuration data at any point in time during or after configuration without the need of additional circuitry. The memory includes a configuration memory array 106, a vertical shift in register 104, a vertical shift out register 107, a horizontal shift register 105, and a configuration logic block 201. The vertical registers 104 and 107 are connected to the rows of the configurable cells via horizontal lines $106_0$–$106_7$, and the horizontal shift register 105 outputs are cascaded to the memory cell by vertical lines $106_8$–$106_{15}$. The horizontal shift register 105 is provided with two extra bit frames, which are used as dummy bits.

The configuration logic block 201 generally includes input pins CONFIG, data bus DIN (0:7) and the clock signal CLK. The block 201 also internally includes various registers etc. During configuration, the data frame is loaded through data bus DIN into the configuration logic 201 and is latched into the various shift registers of the configuration logic. One of the shift registers of the configuration logic 201 then transfers the data frames to the vertical shift in register 104 under the control of clock signal VSR_CLK for the register 104 which is generated by configuration logic 201. The data frame is shifted serially into the bit positions of vertical shift in register 104 using this clocking mechanism. Output bits of vertical shift in register 104 are connected to data lines $106_0$ to $106_7$.

Once the full data frame has been loaded into the register 104 and the CRC circuit flags no error, clock HSR_CLK is generated by configuration logic 201 for enabling the horizontal shift register 105 to address a particular column of the configuration memory array by shifting a high bit, one shift per frame, of data into it. Depending on which of the output bits of the horizontal shift register 105 is high, one of the data lines $106_8$ to $106_{15}$ connected to that bit position is enabled. This allows all the configuration memory cells present in that column to latch the data frame bits stored in the vertical shift in register 104.

Bits $105_0$ and $105_1$ of the horizontal shift register 105 are dummy bits and are not used to address any column. This is done because the first two frames that are loaded after the preamble are test frames to test the data lines for faults. These frames are not to be latched in the configuration memory cells, and to prevent this from happening bits $105_0$ and $105_1$ are prevented from reaching any of the columns when the horizontal shift register 105 starts functioning soon after the loading of the preamble. This is achieved by enabling the storing of data into configuration memory cells only when bit $105_2$ goes high.

To compensate for these additional frames the last frame address that is provided to the configuration logic 201 (to mark the end of the configuration process) is always greater by two than the actual address. The signal HSR_CLK also controls the parallel loading of data into the vertical shift out register 107. Whenever the HSR_CLK goes high, the contents of vertical shift in register 104 get loaded in parallel to the vertical shift out register 107 through data lines $106_0$ to $106_7$. The signal VSR_CLK is also directly connected to the vertical shift out register 107 and enables the serial shifting out of the previous data from the SOUT pin when the next data frame starts loading into the register 104.

Figure 2B:
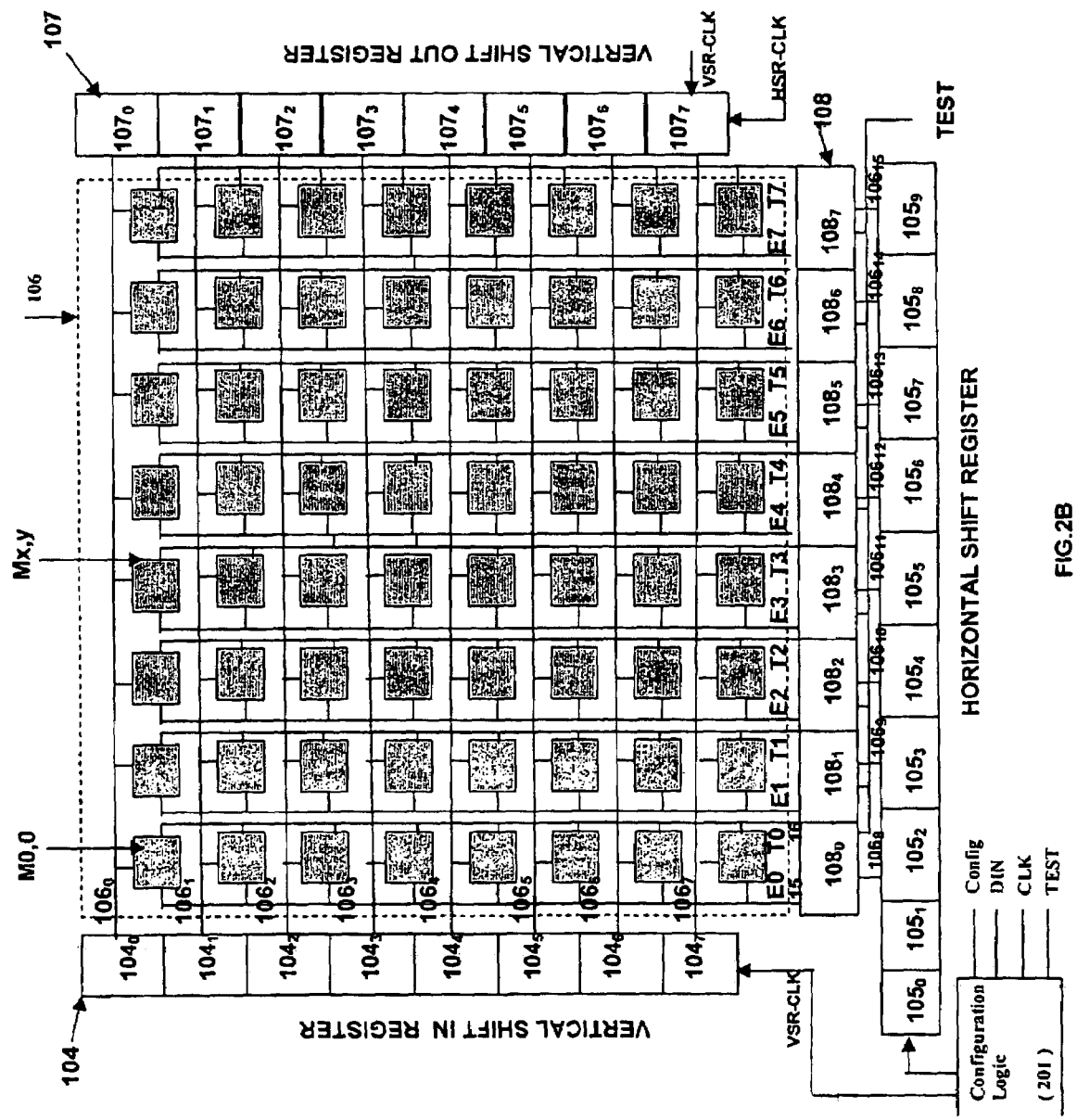
FIG. 2B is a schematic block diagram of a PLD configuration memory in accordance with a second embodiment of the present invention.

Another embodiment of the invention is illustratively shown in FIG. 2B. This embodiment provides an extra control cell 108 and a TEST signal. All the cells of the control unit 108 are connected to lines $106_8$–$106_{15}$. The two outputs of the control cell $E_i$ and $T_i$ are connected across the entire configuration memory array. The output $E_i$ enables a particular column for data entry, whereas the output $T_i$ enables testing of a particular column of the data array.

Figure 2C:
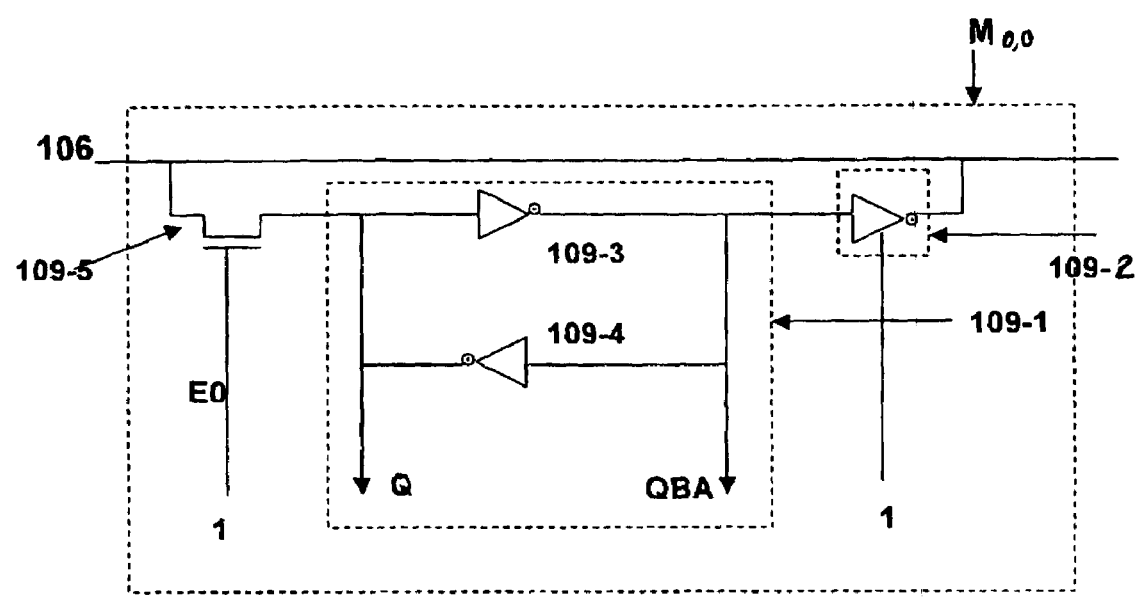
FIG. 2C is a circuit diagram illustrating a configuration memory cell according to the present invention.

Turning now to FIG. 2C, the internal circuit of a single configuration memory cell structure $M_{0,0}$ of FIG. 2B is illustratively shown. Instead of directly attaching the data latch with the horizontal line $106_0$, it is routed through pass transistor 109-5 and a tri-state inverter 109-2. This leaves the line $106_0$ free both during configuration and testing. The signal $E_0$ connects to the gate terminal of pass transistor 109-5, while the signal $T_0$ connects to the enable line of tri-state inverter 109-2. The configuration memory cell 109-1 is formed by two back-to-back inverters 109-3 and 109-4.

Figure 2D:
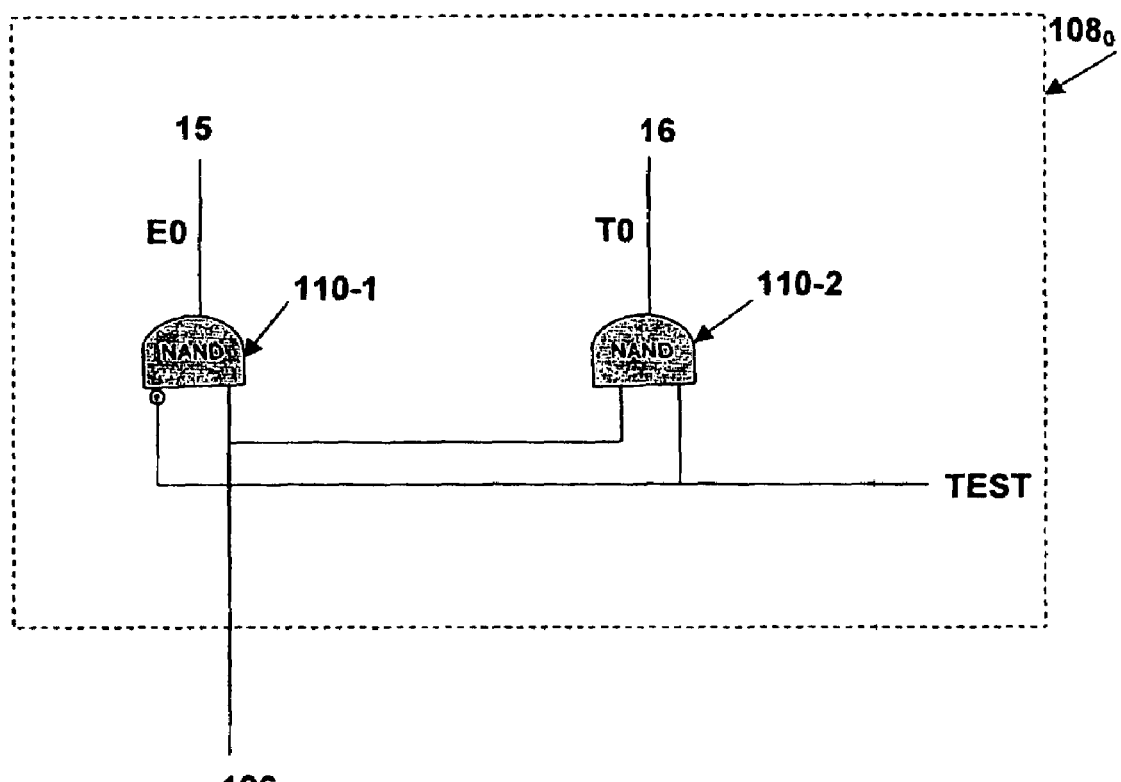
FIG. 2D is a schematic diagram of control circuitry for selecting between the test and configuration modes in accordance with the present invention.
Figure 1A:
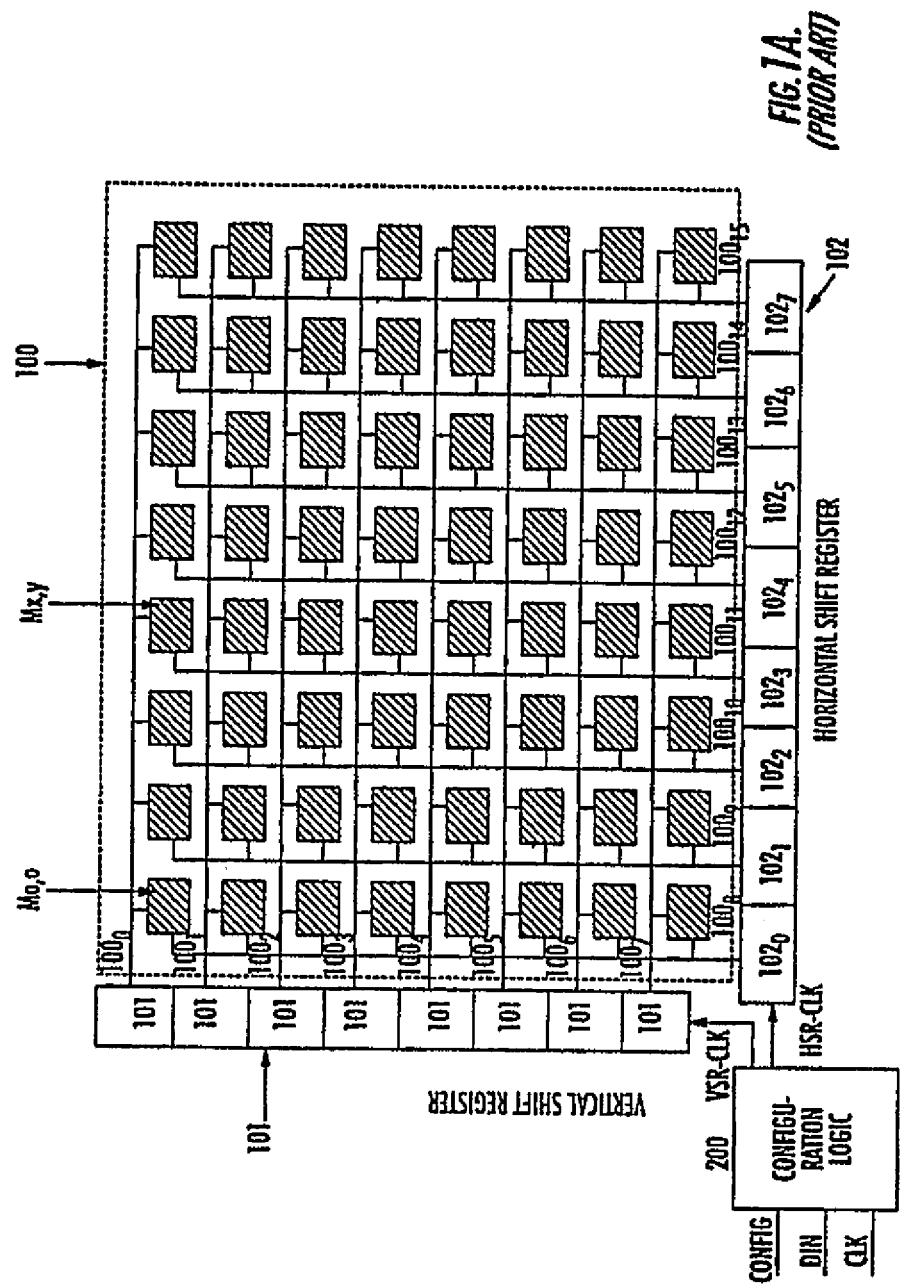
Figure 1B:
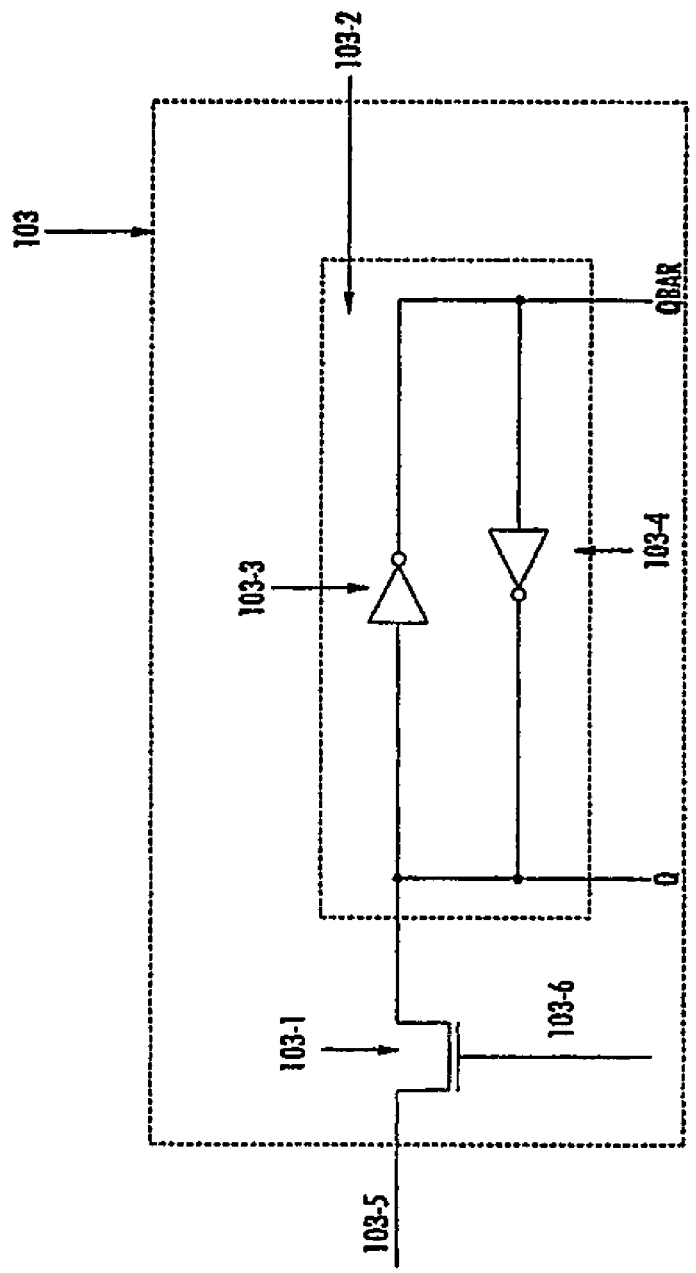
Figure 2A:
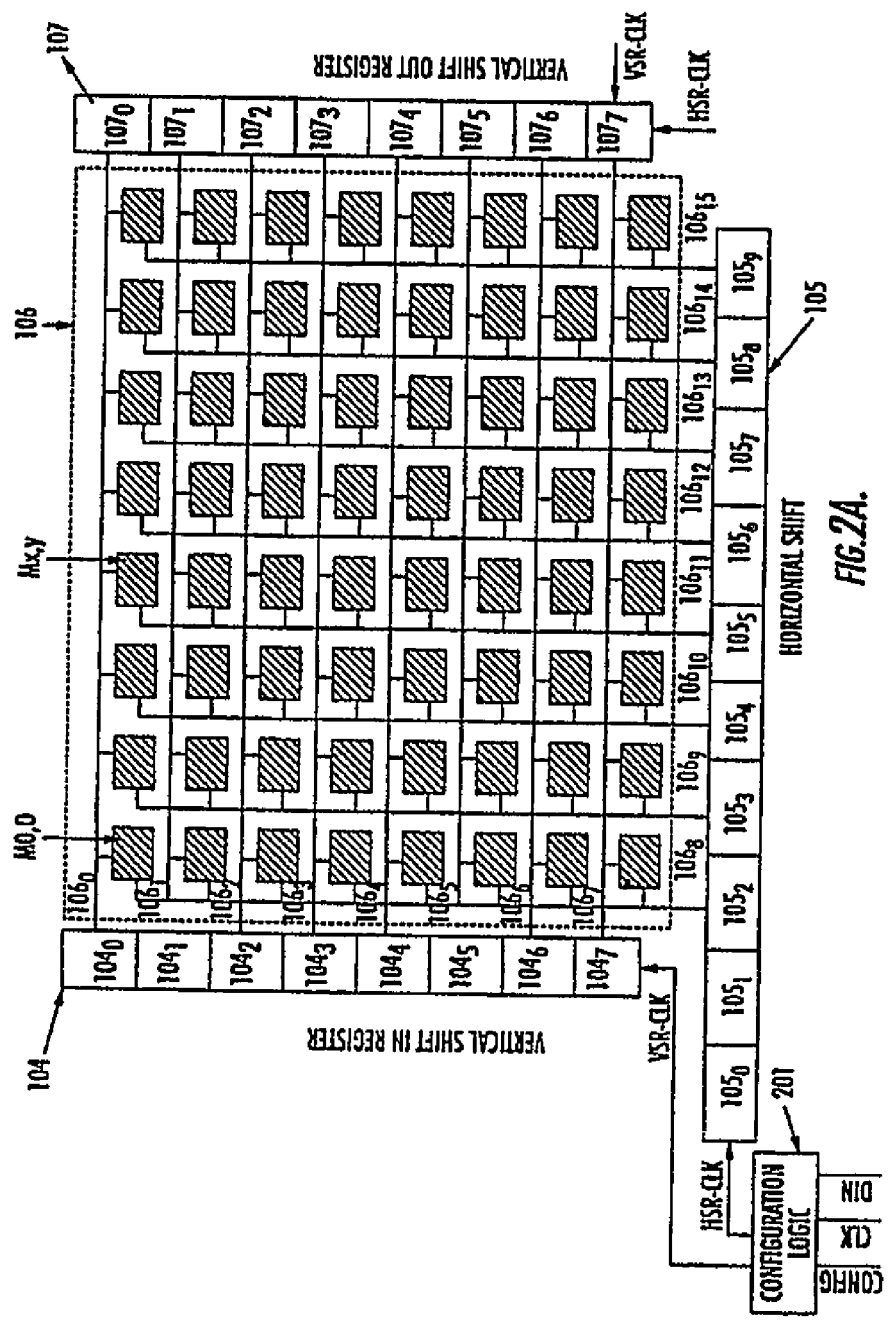
Figure 2B:
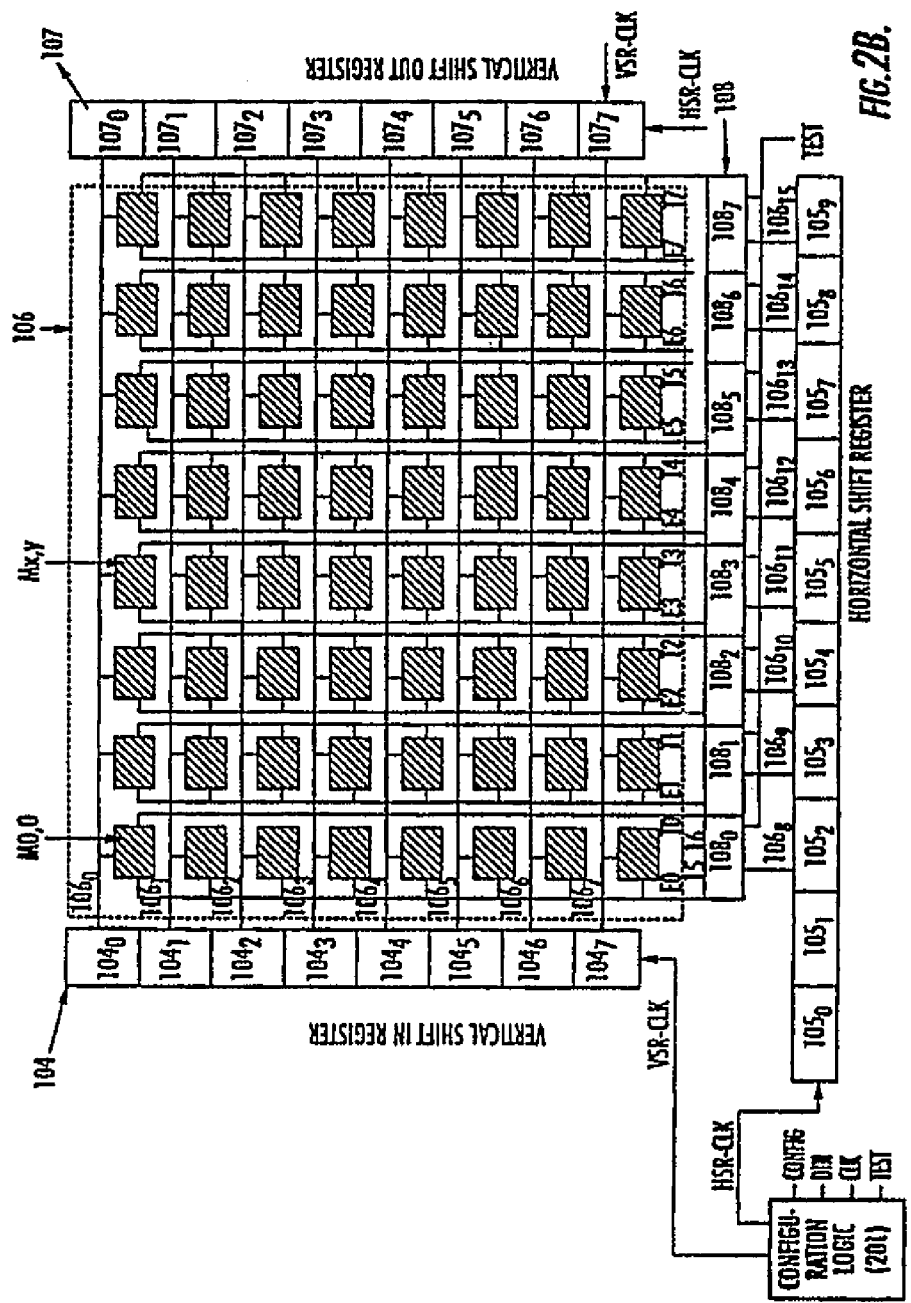
Figure 2C:
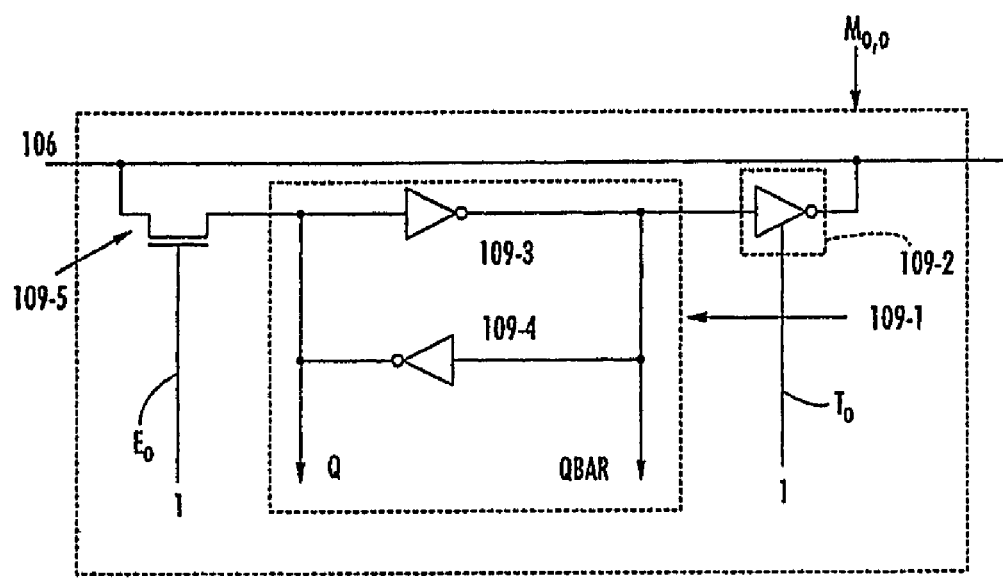
Figure 2D:
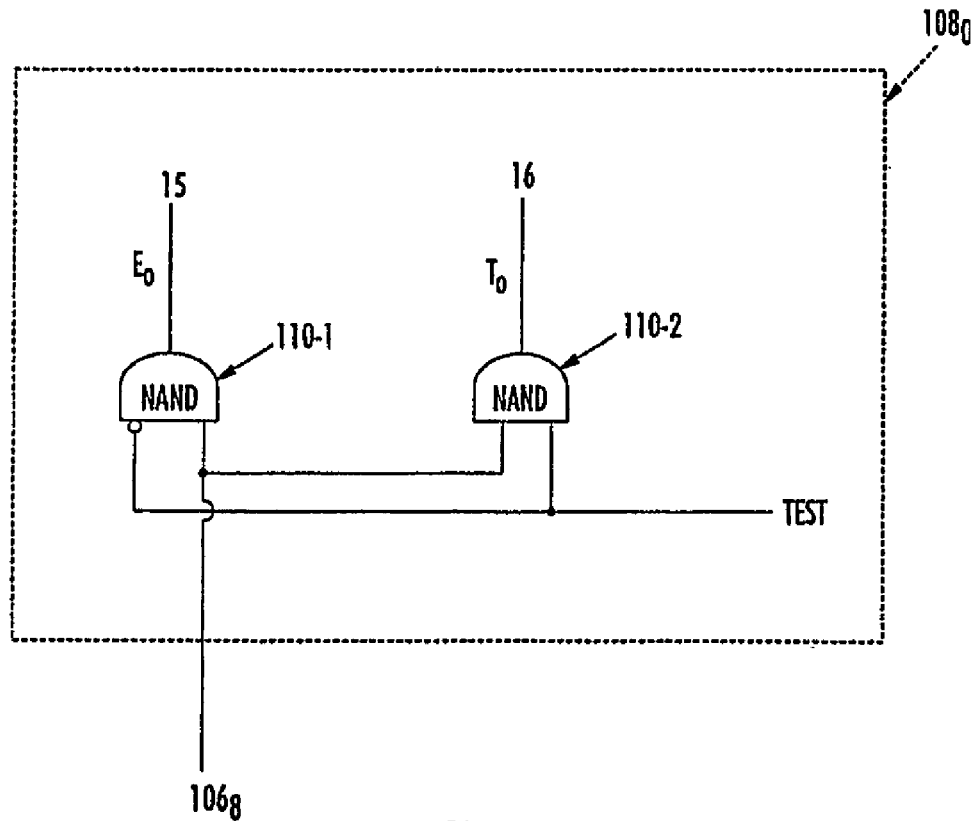

A circuit diagram for one of the cells $108_0$ of the control circuitry 108 is illustratively shown in FIG. 2D. The control circuitry includes two NAND gates 110-1 and 110-2. First input terminals of 110-1 and 110-2 are connected to bit $105_2$ via line $106_8$. The TEST signal coming from the configuration logic 201 is the second input terminal of the NAND gate 110-2, and the inverted TEST signal becomes the second input terminal of 110-1.

To start the configuration, the CONFIG signal goes high for one clock cycle. This generates an internal RESET signal (not shown) that resets the registers of configuration logic 201. The signal TEST is at logic 0 at the time of configuration. This disables all the tri-state inverters because the output Ti gets tied to 0. Before loading the actual data frames, some test bytes are loaded through the data input bus DIN. The first test byte is all 0's. Configuration logic 201 generates the VSR_CLK and the data bits start shifting serially into the vertical shift in register 104.

When the last bit of the frame Din7 gets transferred into bit position $104_7$, the signal VSR_CLK is disabled and HSR_CLK is generated causing the parallel loading of data bits $104_7$ to $104_0$ into bit positions $107_7$ to $107_0$ via data lines $106_7$ to $106_0$. The stored data frame of the vertical shift out register 107 is then shifted out serially from the pin SOUT. If the data bits received from the vertical shift out register 107 include any bit as a logic 1 it would indicate that the data line connected to that particular bit position is stuck at logic 1 (because the data frame provided was all logic 0's). A test byte of all logic 1's may be used in a similar fashion for detecting "stuck at logic 0" faults. This completes the first phase of testing, which verifies that the data lines are working correctly.

The configuration of the data then begins, and when the high bit is shifted into the horizontal shift register 105, bit 105$_2$, the resulting high signal at the gate of pass transistor 109-5 on line 15, allows the configuration bit stored in 104 to enter the latch via data lines 106$_0$, etc. In this mode, the signal TEST remains low resulting in output T$_i$ remaining low, which causes the tri-state inverter 109-2 to be in the high impedance state.

The output on line 15 depends on the value stored at the corresponding bit position of horizontal shift register 105. If the bit is high, the corresponding signal line 106 becomes high, thus giving a high signal at output 15. The gate of the pass transistor 109-5 is connected to line 15 and therefore, 109-5 turns on, allowing the value stored in the corresponding bit of the vertical shift in register 104 to get latched into 109-1 via data line 106$_0$, etc. During configuration when the data frames are latched to an assigned data latch array, testing of the configured data is simultaneously carried-out as follows.

After the first frame has been loaded into the vertical shift in register 104, the clock signal HSR_CLK for the horizontal shift register 105 is generated. The decoding system of the configuration logic 201 causes bit 105$_2$ of the horizontal shift register 105 to go high, which enables the first column of the memory array 106 through the line 15. The latches in that column as well as the vertical shift out register 107 store the bit values present in vertical shift in register bits 104$_0$ to 104$_7$. The serial loading of the second data frame into the vertical shift in register 104 and the serial shifting out of the first frame from the vertical shift out register 107 occur simultaneously.

This enables simultaneous verification of each frame of data. This process continues until all the frames have been loaded. This approach confirms that the configuration logic 201 as well as the vertical shift in register 104 are functionally correct. This is because there is always a possibility that the CRC method does not show any error in the configuration process, but the correct data frame may not reach the vertical shift in register 104, or the vertical shift in register 104 may not be able to transfer data to the correct destination.

After completion of the configuration and simultaneous testing, the latches or column of latches may be further checked individually by raising the TEST signal high. This is the actual testing mode in which each latched value is read back. Setting the signal TEST high causes signal 16 to go high, thus enabling the tri-state inverter 109-2, and the bit stored in the latch 109-1 is read back by the vertical shift out register 107. Also, since the signal TEST remains high, signal 15 stays low. The pass transistor 109-5 thus remains off, and the value stored in the latch 109-1 cannot be overwritten. The signal value of the signal 16 goes high, and the latched value can be read from the output of 109-2.

Configuration block 201 remains functional in this mode too because clock signals VSR_CLK and HSR_CLK are generated in the same way as in the configuration mode. The clock signal VSR_CLK and HSR_CLK enable the vertical shift out register 107 as well as the tri-state inverters synchronously activated for the testing purpose. The configuration block functions in the usual manner, and bit streams of logic 0's can be sent through the input bus DIN. In fact, whatever data is sent through the input bus does not affect the bit values already stored. This is because the input side of each memory cell M$_{x,y}$ remains off since the signal E$_i$ remains tied to 0 due to the high value of the signal TEST.

The horizontal shift register 105 enables the columns of the memory array one by one for reading through data lines T$_i$. The selected column transfers its latched values through the tri-state inverters to data lines 106$_0$ to 106$_7$, which then get loaded in parallel to the vertical shift out register 107. The serial shifting out of the bit stream from vertical shift out register 107 provides the values stored in the individual latches of the particular column.

In accordance with another embodiment of the present invention (not shown), another shift register may be used at the other end of the memory array, parallel to the horizontal shift register 105. This is useful for testing the data lines running vertically upwards from horizontal shift register 105 even before the actual configuration process starts. This register may also be used at the time of configuration to shift out the values stored in the horizontal shift register 105, which will indirectly test the address decoding system of the configuration logic. The present invention thus provides an efficient scheme for testing the configuration process by incorporating only slight modifications in the available configuration resources.

It will be apparent to those skilled in the art that the foregoing is merely illustrative and not intended to be exhaustive or limiting, having been presented by way of example only and that various modifications can be made within the scope of the invention. For example, the configuration memory array could be of any desired size. Further, the vertical shift in register and vertical shift out register could be connected to rows instead of columns of the memory array, while the horizontal shift register is connected to columns instead of rows.

Accordingly, the present invention is not to be considered limited to the specific examples chosen for purposes of explanation, but rather to cover all changes and modifications, which do not constitute departures from the permissible scope of the present invention as set forth in the claims.

That which is claimed is:

1. A programmable logic device (PLD) comprising:
   a configuration memory array comprising a plurality of memory cells and a plurality of data lines connected therebetween;
   a selector for selecting a group of said memory cells;
   an input data storage device connected to said data lines for storing input data for the selected group of said memory cells;
   an output data storage device connected to said data lines; and
   configuration logic for controlling said selector, said input data storage device, and said output data storage device so that the input data is stored in said output data storage device for testing said data lines and without altering data stored in said memory cells.

2. The PLD of claim 1 wherein the input data comprises at least one of configuration data to be stored in the selected group of said memory cells, and test data for testing the selected group of said memory cells.

3. The PLD of claim 1 wherein said memory cells are arranged in rows and columns, and wherein the groups of said memory cells comprise at least one of rows and columns of said memory cells.

4. The PLD of claim 1 wherein said selector comprises: a serial-in parallel-out shift register for providing enabling signals to enable the selected group of said memory cells.

5. The PLD of claim 1 wherein said input data storage device comprises a serial-in parallel-out shift register.

6. The PLD of claim 1 wherein said output data storage device comprises a parallel-in serial-out shift register.

7. The PLD of claim 1 wherein said configuration logic causes said selector to deselect all of said memory cells during storage of the input data in the output data storage device.

8. The PLD of claim 1 wherein the PLD is implemented as a programmable gate array.

9. A method for testing a configuration memory array of a programmable logic device (PLD), the configuration memory array comprising a plurality of memory cells and a plurality of data lines connected therebetween, the method comprising:

storing input data in an input data storage device connected to the data lines; and controlling the input data storage device and an output data storage device also connected to the data lines so that the input data is stored in the output data storage device for testing the data lines and without altering data stored in the memory cells.

10. The method of claim 9 wherein controlling further comprises deselecting all of the memory cells during storage of the input data in the output data storage device.

11. The method of claim 9 wherein the input data comprises at least one of configuration data and test data.

12. The method of claim 9 wherein the memory cells are arranged in rows and columns, and wherein the groups of the memory cells comprise at least one of rows and columns of the memory cells.

13. The method of claim 9 wherein the input data storage device comprises a serial-in parallel-out shift register.

14. The method of claim 9 wherein the output data storage device comprises a parallel-in serial-out shift register.

* * * * *

UNITED STATES PATENT AND TRADEMARK OFFICE
CERTIFICATE OF CORRECTION

PATENT NO. : 7,167,404 B2
APPLICATION NO. : 10/436895
DATED : January 23, 2007
INVENTOR(S) : Pathak et al.

It is certified that error appears in the above-identified patent and that said Letters Patent is hereby corrected as shown below:

The Title Page showing the illustrative figure should be replaced with the attached title page.

In the Drawings
Delete Drawing Sheets 1-6 and replace with attached Drawing Sheets 1-6.

Signed and Sealed this

Eighteenth Day of September, 2007

JON W. DUDAS
*Director of the United States Patent and Trademark Office*

(12) United States Patent
Pathak et al.

(10) Patent No.: US 7,167,404 B2
(45) Date of Patent: Jan. 23, 2007

(54) METHOD AND DEVICE FOR TESTING CONFIGURATION MEMORY CELLS IN PROGRAMMABLE LOGIC DEVICES (PLDS)

(75) Inventors: Shalini Pathak, Haryana (IN); Parvesh Swami, New Delhi (IN)

(73) Assignee: STMicroelectronics Pvt Ltd., Uttar Pradesh (IN)

(*) Notice: Subject to any disclaimer, the term of this patent is extended or adjusted under 35 U.S.C. 154(b) by 513 days.

(21) Appl. No.: 10/436,895

(22) Filed: May 13, 2003

(65) Prior Publication Data
US 2004/0015758 A1   Jan. 22, 2004

(30) Foreign Application Priority Data
May 13, 2002   (IN)   ............... 550/Del/02

(51) Int. Cl.
*G11C 7/00*   (2006.01)

(52) U.S. Cl. ............... 365/201; 365/230.09; 365/221; 365/219; 365/220; 714/742; 714/733; 714/725; 714/763; 714/819

(58) Field of Classification Search ......... 365/201,219, 365/220, 221; 714/742, 733, 725, 763, 819
See application file for complete search history.

(56) References Cited

U.S. PATENT DOCUMENTS

| | | | | |
|---|---|---|---|---|
| 5,430,687 A | * | 7/1995 | Hung et al. | 365/230.08 |
| 5,583,450 A | * | 12/1996 | Trimberger et al. | 326/41 |
| 5,646,545 A | * | 7/1997 | Bertolet et al. | 326/39 |
| 5,732,407 A | * | 3/1998 | Mason et al. | 711/104 |
| 5,778,256 A | * | 7/1998 | Darbee | 710/72 |
| 5,841,867 A | * | 11/1998 | Jacobson et al. | 713/187 |
| 5,970,005 A | * | 10/1999 | Yin et al. | 365/201 |
| 6,009,256 A | * | 12/1999 | Tseng et al. | 703/13 |
| 6,057,704 A | * | 5/2000 | New et al. | 326/38 |
| 6,191,614 B1 | * | 2/2001 | Schultz et al. | 326/41 |
| 6,195,774 B1 | * | 2/2001 | Jacobson | 714/727 |
| 6,237,124 B1 | | 5/2001 | Plants | 714/763 |
| 6,262,596 B1 | * | 7/2001 | Schultz et al. | 326/41 |
| 6,278,290 B1 | * | 8/2001 | Young | 326/41 |
| 6,429,682 B1 | * | 8/2002 | Schultz et al. | 326/41 |
| 6,539,508 B1 | * | 3/2003 | Patrie et al. | 714/726 |
| 6,664,807 B1 | * | 12/2003 | Crotty et al. | 326/40 |

(Continued)

FOREIGN PATENT DOCUMENTS

JP   410097511 A  *  4/1998

(Continued)

*Primary Examiner*—Viet Q. Nguyen
(74) *Attorney, Agent, or Firm*—Lisa K. Jorgenson; Allen, Dyer, Doppelt, Milbrath & Gilchrist, P.A.

(57) ABSTRACT

A programmable logic device (PLD) has the ability to test the configuration memory either independently or during configuration. The PLD may include a selector for selecting a particular column or row of the configuration memory array, and an input data storage device for storing configuration data required to be stored in the selected column or row, or test data for testing the selected column or row. The PLD may also include an output data storage device for storing the output from the selected column or row, and test logic that provides control signals for verifying the correct operation of the data lines of the configuration memory array without disturbing the data stored in the memory array.

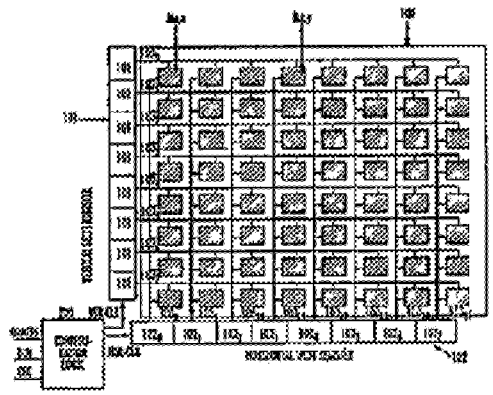

14 Claims, 6 Drawing Sheets